(12) United States Patent
Fukao et al.

(10) Patent No.: US 8,226,802 B2
(45) Date of Patent: Jul. 24, 2012

(54) THIN FILM FORMING APPARATUS, FILM THICKNESS MEASURING METHOD AND FILM THICKNESS SENSOR

(75) Inventors: Masato Fukao, Chigasaki (JP); Toru Kimura, Chigasaki (JP)

(73) Assignee: ULVAC, Inc., Chigasaki-Shi (JP)

( * ) Notice: Subject to any disclaimer, the term of this patent is extended or adjusted under 35 U.S.C. 154(b) by 204 days.

(21) Appl. No.: 12/725,658

(22) Filed: Mar. 17, 2010

(65) Prior Publication Data
US 2010/0187094 A1 Jul. 29, 2010

Related U.S. Application Data

(63) Continuation of application No. PCT/JP2008/066761, filed on Sep. 17, 2008.

(30) Foreign Application Priority Data

Sep. 21, 2007 (JP) .................................. 2007-244744

(51) Int. Cl.
*C23C 14/00* (2006.01)
*C23C 14/32* (2006.01)
(52) U.S. Cl. ........................ 204/192.13; 427/9; 427/10
(58) Field of Classification Search ............. 204/192.13; 427/9, 10
See application file for complete search history.

(56) References Cited

U.S. PATENT DOCUMENTS 3,237,447 A * 3/1966 McKeown ................ 73/86

FOREIGN PATENT DOCUMENTS

| JP | 7-34248 | 2/1995 |
| JP | 9-241844 | 9/1997 |
| JP | 11-222670 | 8/1999 |
| JP | 2003-139505 A1 | 5/2003 |
| JP | 2007024909 A * | 2/2007 |

OTHER PUBLICATIONS

Thickness measurements by quartz microbalance during thin-film growth by organic-molecular-beam deposition M. Campione, M. Cartotti, E. Pinotti, A. Sassella, and A. Borghesi, J. Vac. Sci. Technol. A 22, 482 (2004), DOI:10.1116/1.1690249.* Study and Application of a Linear Frequency—Thickness Relation for Surface-Initiated Atom Transfer Radical Polymerization in a Quartz Crystal Microbalance Jianan He,†Yuanzi Wu,†Jia Wu,†Xiang Mao,†Long Fu,†Tongcheng Qian,†Jing Fang,†Chunyang Xiong,†Jinglin Xie,‡ and, and Hongwei Ma*,† Macromolecules 2007 40 (9), 3090-3096.*
Machine Translation of JP 2007024909A.*
International Search Report for International Application No. PCT/JP2008/066761 dated Oct. 15, 2008.

* cited by examiner

*Primary Examiner* — Luan Van
*Assistant Examiner* — Ibrahime A Abraham
(74) *Attorney, Agent, or Firm* — Kratz, Quintos & Hanson, LLP

(57) ABSTRACT

A technology which is capable of an accurate measurement of the film thickness even if an exfoliation occurs is provided. A difference frequency $\Delta f_0$ is calculated from a resonance frequency $f_0$ of a film thickness sensor at a current time $a_0$ and a resonance frequency $f_1$ at an immediate past time $a_1$, and whether the exfoliation has occurred or not is detected from its sign and a comparison result relative to a reference value. When the exfoliation has occurred, a corrected film thickness value T' is obtained by adding the thickness $\Delta t_0$ of the exfoliation film to an increased film thickness value T which is determined from a resonance frequency $f_x$ measured at a future time $a_x$ to be converted to the thickness of a film on a film forming object, and whether the formation of the film should be terminated is judged in comparison to an aimed value. Thus, even if the exfoliation occurs in the film thickness sensor, the film thickness value of the thin film on the surface of the film forming object can be accurately obtained.

2 Claims, 3 Drawing Sheets

THIN FILM FORMING APPARATUS, FILM THICKNESS MEASURING METHOD AND FILM THICKNESS SENSOR

This application is a continuation of International Application No. PCT/JP2008/066761, filed on Sep. 17, 2008, which claims priority to Japan Patent Application No. 2007-244744, filed on Sep. 21, 2007. The contents of the prior application is herein incorporated by reference in their entireties.

BACKGROUND OF THE INVENTION

The present invention relates to a crystal type film thickness meter; and more particularly, the invention relates to a film thickness meter capable of measuring an accurate film thickness, even if a film is peeled.

When a film is formed on a processing object (such as, glass, wafer, etc.) in a vacuum by an evaporation method or the like, a crystal type film thickness meter is used in order to control the film thickness of the thin film during its growth period.

In order to obtain a desired film thickness of the thin film, the film thickness value of the thin film during the film formation is monitored by the crystal type film thickness meter; and the process with a constant film thickness is made possible by terminating the process when the film thickness reaches an aimed film thickness which has been preliminarily set.

Since the film thickness of the thin film formed on the processing object by such a method depends on a numerical value indicated as a film thickness value by the film thickness meter, it is important that the thickness of the film is accurately measured by the film thickness meter in order to stabilize product quality.

From films repeatedly deposited on a crystal oscillator, sometimes exfoliations can occur. If the thin film attached to the surface of the crystal oscillator exfoliates, the film thickness of the exfoliated portion can be removed from the film thickness before the exfoliation. However, the thin film of the processing object is not exfoliated; and thus, the film thickness of the formed film becomes greater than the aimed film thickness if the vapor deposition is terminated when the measured value of the film thickness meter has reached the aimed film thickness, which can result in defective products produced depending upon the thickened degrees.

Since a serious influence can be made particularly in a process during which a thin film having very thin thickness is formed, a measuring technique for avoiding such a problem has been desired.

See, Japan Patent Document JP-A 11-222670.

SUMMARY OF THE INVENTION

The present invention, which has been made to solve the problem of the above-mentioned conventional art, provides a technology capable of accurately measuring the thickness of a film even if exfoliation occurs.

In order to solve the above problem, an embodiment of the present invention is directed to a thin film forming apparatus, having a vacuum chamber, a thin film material source, disposed inside the vacuum chamber for emitting particles of a thin film material, a crystal oscillator disposed in a position inside the vacuum chamber where the particles of the thin film material are to be attached, and a measuring device for measuring a resonance frequency of the crystal oscillator. In the thin film forming apparatus in such embodiment of the present invention, while a thin film is made to grow with the particles of the thin film material on surfaces of a film forming object and of the crystal oscillator disposed inside the vacuum chamber, the resonance frequency is repeatedly measured, the film thickness of the thin film formed on the surface of the film forming object from a starting time of the growth period of the thin film to a current time is calculated based on a measurement result at the current time and a measurement result at the starting time of the growth period of the thin film for comparison to an aimed value in order to terminate the growth period of the thin film based on the comparison results. The measuring device determines a change value of the frequency, which is different between the measurement result at the current time and a measurement result at a past time which is immediately before the current time in order to calculate a thickness value of an exfoliated film based on the change value of the frequency, when the thin film of the surface of the crystal oscillator was exfoliated. A corrected film thickness value is obtained by adding the film thickness value of the exfoliated film to the determined film thickness value of the thin film of the surface of the crystal oscillator based on a measurement result at a future time after the current time and a measurement result at the starting time of the growth; and the corrected film thickness value is converted to a thickness value of the film on the surface of the film forming object so as to compare the converted film thickness value to the aimed value.

The present embodiment may be directed to a thin film forming apparatus, wherein when the change value of the frequency shows a decrease in the film thickness and the absolute value of the change value of the frequency is greater than a reference value, an exfoliation of the thin film is judged as having occurred on the surface of the crystal oscillator.

An embodiment of the present invention may also be directed to a thin film forming apparatus having a vacuum chamber, a thin film material source disposed inside the vacuum chamber for emitting particles of a thin film forming material, a crystal oscillator disposed in a position inside the vacuum chamber where the particles of the thin film material are to be attached, a measuring device for measuring the resonance frequency of the crystal oscillator, the thin film forming apparatus configured such that, while a thin film is made to grow with the particles of the thin film material on surfaces of a film forming object and of the crystal oscillator arranged inside the vacuum chamber, the resonance frequency is repeatedly measured to calculate a film thickness of the thin film formed on the film forming object from the starting time of the growth period to the current time based on a moving average of measurement results at a plurality of times including the current time and the measurement result at a reference time so that the growth of the thin film is terminated based on comparison results in comparison to an aimed value, wherein, when the moving average decreases, the measuring device determines a minimum value during a time period in which the moving average increases after it begins to decrease in order to calculate a thickness value of an exfoliated film from a difference between the moving average immediately before the decrease and the minimum value, when the thin film of the surface of the crystal oscillator was exfoliated, for obtaining a corrected film thickness value by adding the thickness value of the exfoliated film to the film thickness value of the thin film on the surface of the crystal oscillator, which is determined based on the measurement result at a future time after the current time and the measurement result at the starting time of the growth period, so that the corrected film thickness value is converted to the thickness value of the film on the surface of the film forming object in order to compare the converted value to an aimed value.

An embodiment of the present invention may be directed to a method for measuring a film thickness, in which a thickness of a thin film formed on a surface of a film forming object from a starting time of the growth period of the thin film to a current time is calculated based on a measurement result at the current time and a measurement result at the starting time of the growth period of the thin film by making particles of a thin film material emitted from a thin film material source attach onto the surface of the film forming object and a surface of a crystal oscillator in order to measure a resonance frequency of the crystal oscillator. The method for measuring a film thickness includes the steps of: obtaining a frequency change value which is a difference between the measurement result at the current time and a measurement result at a past time immediately before the current time; and when an exfoliation of the thin film on the surface of the crystal oscillator occurs: calculating a thickness value of an exfoliated film based on the frequency change value; obtaining a corrected film thickness value by adding the thickness value of the exfoliated film to an increased film thickness value which is obtained based on a measurement result at a future time after the current time and the measurement result at the starting time of the growing of the thin film; and converting the corrected film thickness value to the thickness value of the thin film on the surface of the film forming object.

The present embodiment may be directed to the film thickness measuring method, in which a thickness of a thin film formed on a surface of a film forming object from a starting time of the growth period of the thin film to a current time is calculated based on a moving average by making particles of a thin film material emitted from a thin film material source attach onto the surface of the film forming object and a surface of a crystal oscillator to repeatedly measure a resonance frequency of the crystal oscillator so as to obtain the moving average of the thin film on the surface of the crystal oscillator based on measurement results of a plurality of times including the current time and the starting time of the growth period of the thin film. The method for measuring a film thickness, when an exfoliation of the thin film on the surface of the crystal oscillator occurs and the moving average decreased, includes the steps of: obtaining a minimum value of the moving average during a time period from after the beginning of a decrease to the turning into an increase; calculating a thickness of the exfoliated film based on a difference between the moving average immediately before the decrease begins and the minimum value; obtaining a corrected film thickness value by adding the thickness value of the exfoliated film to the moving average calculated based on the measurement result at a future time after the current time and the measurement result at the starting time of the growth period; and converting the corrected film thickness value to the thickness value of the film on the surface of the film forming object.

An embodiment of the present invention may be directed to a film thickness sensor, having a crystal oscillator disposed in a position to which particles of a thin film material are to be attached; and a measuring device for repeatedly measuring a resonance frequency of the crystal oscillator at a plurality of times, wherein the measuring device determines a frequency change value, which is a difference between a measurement value at a current time among the repeated measurements and a measurement value at a past time before the current time so as to calculate the thickness value of an exfoliated film based on a frequency change value, when the thin film of the surface of the crystal oscillator was exfoliated so that a corrected film thickness value is obtained by adding the thickness value of the exfoliated film to a film thickness value of the thin film on the surface of the crystal oscillator which is determined based on a measurement value at a future time after the current time.

The present embodiment may be further directed to the film thickness sensor, wherein when the frequency change value shows a decrease in the film thickness and the absolute value of the frequency change value is greater than a reference value, an exfoliation of the thin film is judged as being on the surface of the crystal oscillator.

Since the thickness of the exfoliated film is calculated and added to the film thickness obtained from the measurement value after the exfoliation, the film thickness can be accurately determined.

BRIEF DESCRIPTION OF THE DRAWINGS

FIG. 2($b$) is a graph showing changes in the increased film thickness values obtained from the resonance frequencies.

FIG. 3($b$) is a graph showing changes in the increased film thickness determined from the resonance frequencies; and FIG. 3($c$) is a graph showing changes in the increased film thickness value by a moving average method.

DETAILED DESCRIPTION OF THE INVENTION

Figure 1:
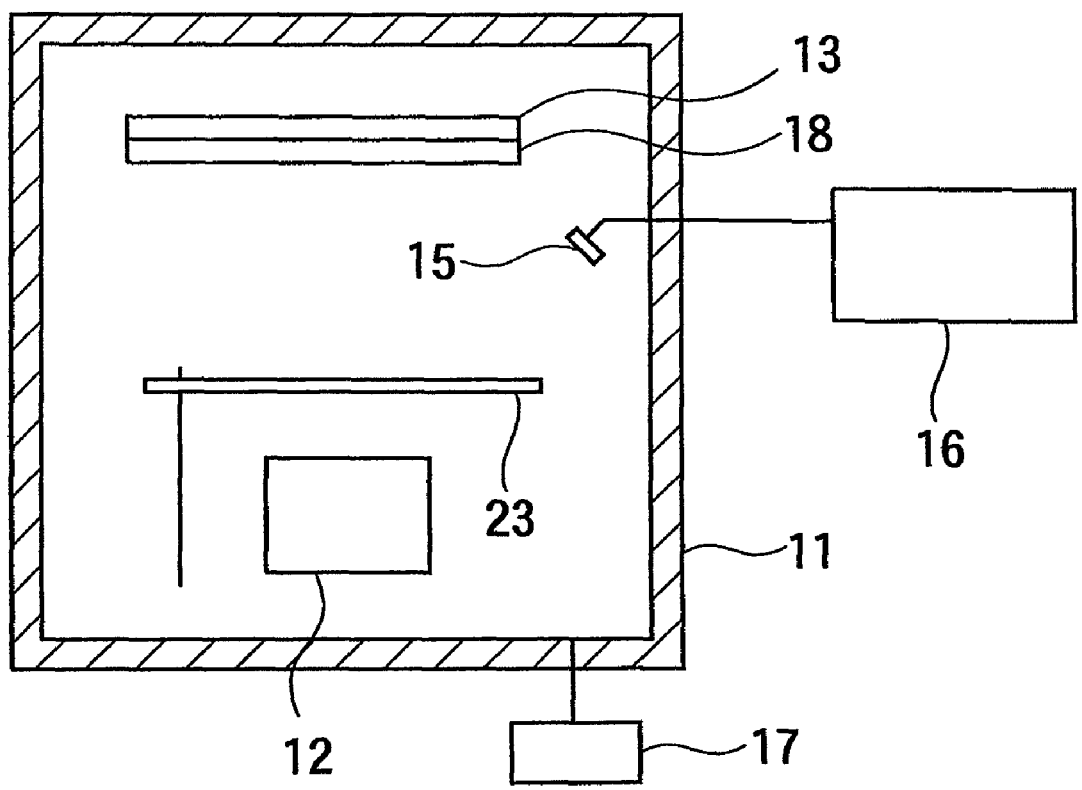
FIG. 1 is a schematic diagram illustrating a thin film forming apparatus to be used in an embodiment of the present invention.

In FIG. 1, a reference numeral 1 generally denotes a thin film forming apparatus according to an embodiment of the present invention, which possesses a vacuum chamber 11 and a thin film material source 12 arranged inside the vacuum chamber 11.

A substrate holder 13 is arranged at a position opposed to the thin film material source 12 inside the vacuum chamber 11.

A film thickness sensor 15 having a crystal oscillator is arranged near the substrate holder 13.

A vacuum evacuation system 17 is connected to the vacuum chamber 11; and after a film forming object 18 formed of a semiconductor substrate or a glass substrate is held by the substrate holder 13 and the interior of the vacuum chamber 11 is evacuated to vacuum by operating the vacuum evacuation system 17, particles of a thin film material from the thin film material source 12 are emitted outside the thin film material source 12 with a shutter 23 above the thin film material source 12 being closed.

In this embodiment, the thin film material source 12 includes a vapor deposition vessel and the thin film material arranged inside the vapor deposition vessel, so that a vapor of the thin film material is produced as the particles of the thin film material by heating the thin film material. However, the thin film material source 12 can be formed of a sputter target which is a thin film material formed into a plate to produce the particles of the thin film material by sputtering the sputter target with a plasma of a sputtering gas introduced into the vacuum chamber.

When the emission of the particles of the thin film material is stabilized, the shutter 23 is opened in order to emit the particles of the thin film material inside the vacuum chamber 11, the particles of the thin film material reach the film forming object 18, and a thin film grows on a surface of the film forming object 18.

The film thickness sensor 15 is arranged in a position such that it does not prevent the vapor of the thin film material from reaching the surface of the film forming object 18; and, in addition, the vapor of the thin film material reaches the sensor 15, so that a thin film also grows on a surface of the film thickness sensor 15.

Since the crystal oscillator has a specific resonance frequency, when an AC voltage is applied with the frequency being changed, a resonance phenomenon appears when the wavelength of the AC voltage becomes equal to the specific resonance frequency.

A measuring device 16 is connected to the film thickness sensor 15 so that the resonance phenomenon may be detected when the measuring device 16 applies the AC voltage to the film thickness sensor 15; and when the frequency at which the resonance phenomenon appears is specified, the resonance frequency of the crystal oscillator is determined.

Since the measuring device 16 measures the resonance frequency at a regular time interval, when the film thickness of the thin film on the surface of the film thickness sensor 15 at a reference time $a_s$ is taken as $t_s$ and the resonance frequency of the film thickness sensor 15 is taken as $f_s$, there is a constant relationship between the film thickness $t_0$ and the resonance frequency $f_0$ at the current time $a_0$, and an increased film thickness value T ($=t_0-t_s$), which is a difference between the film thickness $t_0$ at the current time $a_0$ and the film thickness $t_s$ at the reference time $a_s$, can be calculated from the resonance frequency $f_s$ at the reference time and the resonance frequency $f_0$ at the current time.

For example, the following equation can be approximately written as:

$$T(=t_0-t_s)=-K(f_0-f_s)/\rho \qquad (1)$$

(K is a proportional constant, and ρ is the density of the thin film.)

When the reference time $a_s$ is set as a time for starting the formation of the thin film, the increased film thickness value T is the film thickness of the thin film grown after the start of the film formation.

The ratio between the film thickness of the thin film grown on the surface of the film thickness sensor 15 and the film thickness of the thin film grown on the surface of the film forming object 18 is constant, and the value of that ratio is preliminarily determined. Therefore, the thickness of the film on the surface of the film forming object 18 can be determined by measuring the film thickness of the thin film on the surface of the film thickness sensor 15.

In this thin film forming apparatus 1, a computer is provided inside the measuring device 16, and the film thickness of the thin film to be formed on the surface of the film forming object 18 is preliminarily inputted by an input unit of this computer, to be stored in a storage unit as an aimed value, which is a criterion for terminating the formation of the thin film.

The portion of the surface of the film thickness sensor 15 on which the thin film is to be grown is directed downwardly inside the vacuum chamber 11, and the thin film grown on the surface of the film thickness sensor 15 may be exfoliated and dropped in a vertical downward direction (i.e., exfoliation).

Figure 2:
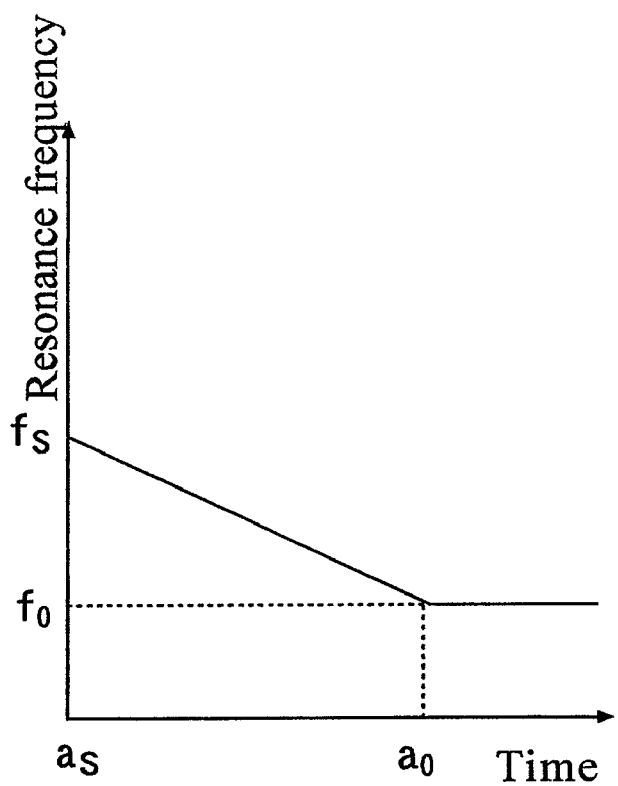
FIG. 2($a$) is a graph showing changes in the resonance frequency when no peeling occurs.
Figure 2:
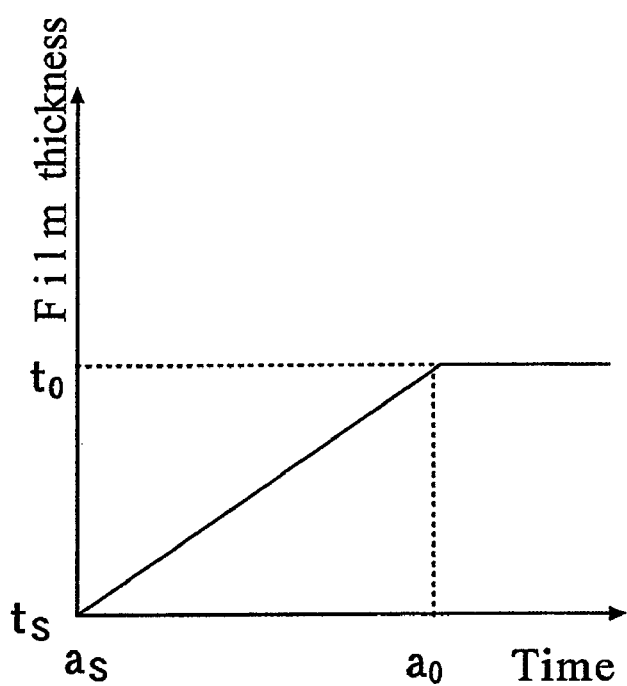

FIGS. 2(a) and 2(b) are graphs showing the transition of the measurement values of the resonance frequency and the transition of the film thickness values determined from the measurement values in a case where no exfoliation has occurred in the thin film on the crystal oscillator. When the film thickness of the thin film of the surface of the crystal oscillator increases, the resonance frequency decreases.

With the starting time of the formation of the film be the reference time $a_s$, the measuring device 16 calculates the increased film thickness value T at the current time $a_0$, which is a difference between the film thickness $t_s$ at the reference time $a_s$ and the film thickness $t_0$ at the current time $a_0$, from the resonance frequency $f_s$ measured at the reference time $a_s$ and the resonance frequency $f_0$ measured at the current time $a_0$; then, with no time delay, converts the increased film thickness value T to a comparison film thickness value which is the thickness of the film on the surface of the film forming object 18 and compares it with the aimed value. When the comparison film thickness value becomes the same as or greater than the aimed value, the shutter 23 is closed in order to terminate the formation of the thin film.

Figure 3:
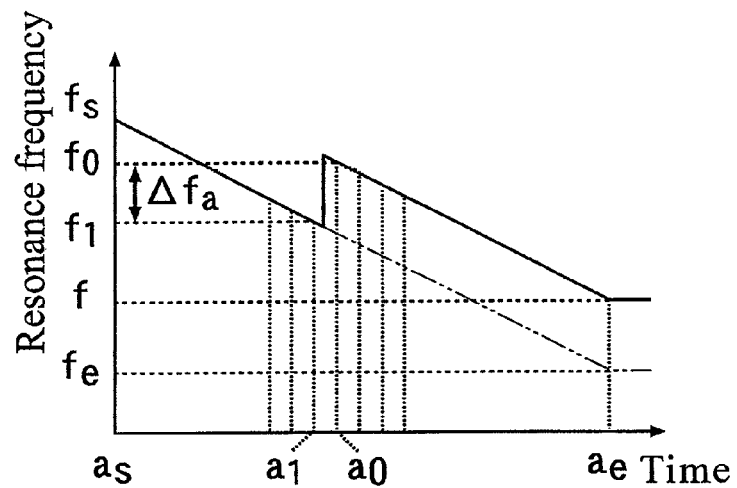
FIG. 3($a$) is a graph showing changes in the resonance frequency when exfoliation occurs.
Figure 3:
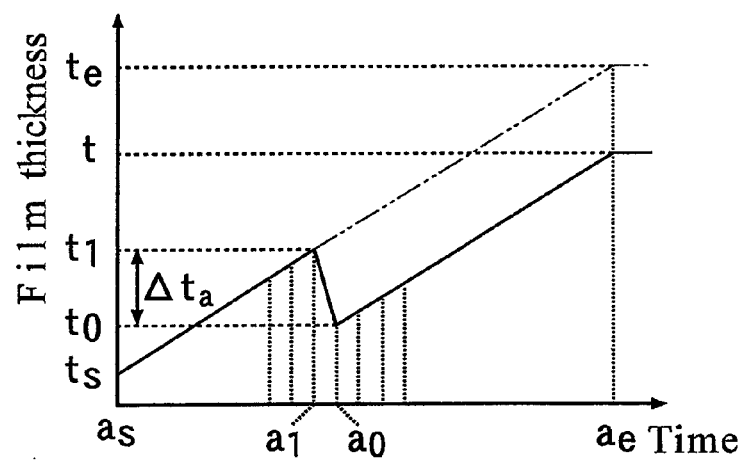
Figure 3:
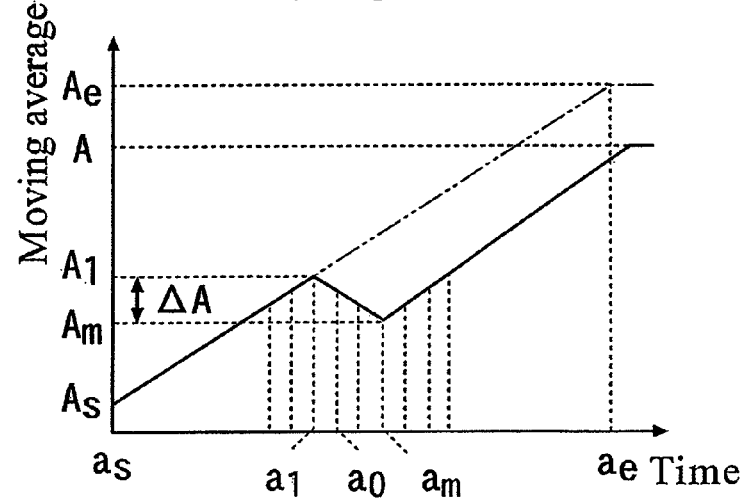

Next, FIG. 3(a) and FIG. 3(b) are graphs showing the transition of measurement values of the resonance frequency including future Limes (measurement times in the future) and the transition of film thickness values determined by the measurement values, when exfoliation has occurred between the current time $a_0$ and the past time (the measurement time in the past) $a_1$ immediately before the current time $a_0$.

Every time the measuring device 16 measures the resonance frequency, it determines a difference frequency $\Delta f_a$ ($=f_0-f_1$), which is a difference between the resonance frequency $f_0$ at the current time $a_0$ and the resonance frequency $f_1$ at the past time $a_1$ immediately before the current time $a_0$, so that the measuring device 16 calculates the thickness of the exfoliated film $\Delta t_a$ ($\Delta t_a>0$), which causes the occurrence of the difference frequency $\Delta f_a$, from the difference frequency $\Delta f_a$.

In the thin film forming apparatus 1 of an embodiment of the present invention, a threshold value at which an exfoliation is judged as having occurred beyond an absolute error is inputted into the measuring device 16 from the input unit, and that value is set as a reference value.

The measuring device 16 compares the thickness $\Delta t_a$ of the exfoliated film with the reference value, and judges that an exfoliation occurs when the sign of the difference frequency $\Delta f_a$ shows the decrease of the film thickness; and, in addition, when the thickness of the exfoliated film $\Delta t_a$ is equal or greater than the reference value.

When an exfoliation has occurred, a corrected film thickness value T' ($=T_x+\Delta t_0$) is obtained by adding the thickness $\Delta t_0$ of the exfoliated film to the increased film thickness value $T_x$ which is calculated from a measurement result $f_x$ at a future time $a_x$ after the exfoliation; the corrected film thickness value T' is converted to the thickness value of the film on the surface of the film forming object 18; the converted value is compared as a comparison film thickness value to the aimed value; and when the comparison film thickness value becomes equal to or greater than the aimed value, the formation of the thin film is terminated.

Meanwhile, the inputted reference value may be converted to a difference frequency $\Delta f$ the resonance frequency corresponding to the film thickness, so that, with the difference frequency $\Delta f$ used as the reference value, the difference frequency $\Delta f_a$ measured at the current time $a_0$ may be compared to the reference value in order to judge an exfoliation as having occurred when the sign of the difference frequency $\Delta f_a$ indicates the decrease in the film thickness and when the difference frequency $\Delta f_a$ is equal to or greater than the reference value.

In addition, in this example, although the film thickness of the thin film to be formed on the surface of the film forming object 18 is used as the aimed value, the film thickness value of the thin film formed on the surface of the film thickness sensor 15 is converted to the thickness value of the film on the surface of the film forming object to compare as the comparison film thickness value to the aimed value, and when the film thickness of the thin film which should be formed on the surface of the film forming object 18 is inputted from an input unit, the inputted film thickness value is converted to a thickness of the film on the surface of the film thickness sensor 15 to be used as the aimed value, and the formation of the thin film may be terminated on the basis of a comparison result between the aimed value and the corrected film thickness value T'.

Also, although the above example is a case where an exfoliation has occurred once, when exfoliations have occurred at a plurality of times beyond an acceptable film thickness value (in other words, when further exfoliation beyond the acceptable film thickness value occurs after a corrected film thickness value $T'(=T+\Delta t_0)$ is calculated in the first exfoliation), thicknesses $\Delta t_1, \Delta t_2, \ldots$ of exfoliated films are determined from differing frequencies every time such an exfoliation occurs, to be added to the corrected film thickness value $T'(=T+\Delta t_0)$. In other words, when exfoliated film thicknesses $\Delta t_0, \Delta t_1, \ldots, \Delta t_{n-1}$ occurs by n times exfoliations, respectively, the corrected film thickness value only has to be a value $(T+\Delta t_0+\Delta t_0+\Delta t_1+\ldots+\Delta t_{n-1})$ in which all of them are added to the increased film thickness value T.

In addition, in the above-discussed embodiment, letting the time of starting the film formation be the reference time $a_s$, the increased film thickness value $T$ $(t_0-t_s)$, which is the difference between the film thickness $t_s$ at the reference time $a_s$ and the film thickness $t_0$ at the current time $a_0$, is determined from the resonance frequency $f_s$ at the reference time $a_s$ and the resonance frequency $f_0$ at the current time $a_0$. However, the increased film thickness value T may be a moving average A of the film thicknesses $t_0$ to $t_n$, which are determined from the resonance frequencies $f_s$, $f_o$ to $f_n$ of the subsequent current and past times $a_0$ to $a_n$ ($a_n$ is a past time before n times (immediately before is defined as one time earlier)) including the current time $a_0$.

The moving average A can be obtained, for example, by the symbol A of the following formula (2):

$$A=(k_0 \cdot t_0 + k_1 \cdot t_1 + \ldots k_{n-1} \cdot t_{n-1})/n \quad (2)$$

($k_0$ to $k_{n-1}$ are coefficients; and the sum of $k_0$ to $k_{n-1}$ is n).

In this case, although exfoliation can be detected by the transition of the moving average A, even when the resonance frequency rapidly changes through the occurrence of the exfoliation, the value of the moving average A does not change rapidly; in other words, the value of the moving average A is at a minimum value after a time immediately after the occurrence of the exfoliation.

FIG. 3(c) is a graph showing the moving average A corresponding to the changes of the resonance graph in (a) of the same figure, and the minimum value is at the time $a_m$ after the exfoliation.

In addition, the number of data for calculating the moving average is preliminarily set in the above-mentioned formula (2); and when the time interval for sampling the data are constant, $k_0$ to $k_{n-1}$ may be "1".

Further, when some frequency change by a set level or more occurs, the interval for sampling the data may be varied. In this case, the values of $k_0$ to $k_{n-1}$ may be varied so as to meet the interval.

A difference $\Delta A$ ($=A_1-A_m$) between the moving average $A_1$ determined at the time $a_1$ immediately before the exfoliation and the minimum moving average $A_m$ is calculated, and a value ($=A_x+\Delta A$), in which the calculated value is added to the moving average $A_x$ determined at a future time $a_x$ after the exfoliation, may be the increased film thickness value.

Although the probability that the absolute error is judged as an exfoliation can be decreased by using the moving average A, a response becomes slow. The exfoliation judgment may also be carried out by using the moving average in order to determine the thickness of the exfoliated film from the above-discussed difference frequency.

What is claimed is:

1. A method for measuring a film thickness in which a thickness of a thin film formed on a surface of a film forming object from a starting time of growing of the thin film to a current time is calculated based on a measurement result at the current time and a measurement result at the starting time of the growing of the thin film by making particles of a thin film material emitted from a thin film material source attach onto the surface of the film forming object and a surface of a crystal oscillator to measure a resonance frequency of the crystal oscillator, the method for measuring a film thickness comprising the steps of:

during the growing of the thin film, obtaining a frequency change value which is a difference between the measurement result at the current time and a measurement result at a past time immediately before the current time; and when an exfoliation of the thin film on the surface of the crystal oscillator occurs:

calculating a thickness value of an exfoliated film based on the frequency change value;

obtaining a corrected film thickness value by adding the thickness value of the exfoliated film to an increased film thickness value which is obtained based on a measurement result at a future time after the current time and the measurement result at the starting time of the growing of the thin film; and converting the corrected film thickness value to the thickness value of the thin film on the surface of the film forming object.

2. A method for measuring a film thickness in which a thickness of a thin film formed on a surface of a film forming object from a starting time of growing of the thin film to a current time is calculated based on a moving average by making particles of a thin film material emitted from a thin film material source attach onto the surface of the film forming object and a surface of a crystal oscillator to repeatedly measure a resonance frequency of the crystal oscillator so as to obtain the moving average of the thin film on the surface of the crystal oscillator based on measurement results of a plurality of times including the current time and the starting time of the growing of the thin film, the method for measuring a film thickness, when an exfoliation of the thin film on the surface of the crystal oscillator occurs and the moving average decreased, comprising the steps of:

during the growing of the thin film, obtaining a minimum value of the moving average during a time period from after the beginning of decrease to turning into increase;

calculating a thickness of the exfoliated film based on a difference between the moving average immediately before the decrease begins and the minimum value, obtaining a corrected film thickness value by adding the thickness value of the exfoliated film to the moving average calculated based on the measurement result at the future time after the current time and the measurement result at the starting time of the growing, converting the corrected film thickness value to the thickness value of the film on the surface of the film forming object.

* * * * *